United States Patent
Hanagandi et al.

(10) Patent No.: US 8,918,690 B2
(45) Date of Patent: Dec. 23, 2014

(54) DECREASING POWER SUPPLY DEMAND DURING BIST INITIALIZATIONS

(71) Applicant: International Business Machines Corporation, Armonk, NY (US)

(72) Inventors: Deepak I. Hanagandi, Bagalkot (IN); Krishnendu Mondal, Bangalore (IN); Michael R. Ouellette, Westford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/732,711

(22) Filed: Jan. 2, 2013

(65) Prior Publication Data

US 2014/0189448 A1     Jul. 3, 2014

(51) Int. Cl.
*G01R 31/28* (2006.01)
*G11C 29/12* (2006.01)

(52) U.S. Cl.
CPC .............................. *G11C 29/12015* (2013.01)
USPC ........................................ 714/733; 714/718

(58) Field of Classification Search
CPC ...................... G01C 29/12015; G01R 31/3187; G01R 31/31724; G01R 31/318552
USPC ........ 324/750.3; 714/729, 731, 733, 718, 724
See application file for complete search history.

(56) References Cited

U.S. PATENT DOCUMENTS

| | | | |
|---|---|---|---|
| 6,779,144 B2 | 8/2004 | Hayashi et al. | |
| 7,043,670 B2 | 5/2006 | Alani et al. | |
| 7,249,291 B2 | 7/2007 | Rasmussen et al. | |
| 7,320,094 B2 | 1/2008 | Lee et al. | |
| 7,363,563 B1 | 4/2008 | Hissen et al. | |
| 7,484,141 B2 | 1/2009 | Shikata | |
| 7,610,531 B2 | 10/2009 | Dhong et al. | |
| 8,091,002 B2 * | 1/2012 | Wang et al. | 714/731 |
| 2009/0063921 A1 | 3/2009 | Aipperspach et al. | |
| 2010/0138709 A1 * | 6/2010 | Wang et al. | 714/731 |
| 2010/0218057 A1 | 8/2010 | Maki et al. | |
| 2011/0296265 A1 | 12/2011 | Rakheja et al. | |
| 2013/0318414 A1 * | 11/2013 | Sinanoglu | 714/729 |
| 2014/0132291 A1 * | 5/2014 | Somachudan et al. | 324/750.3 |
| 2014/0189454 A1 * | 7/2014 | Puvvada et al. | 714/729 |

OTHER PUBLICATIONS

Wu et al., "Logic BIST Architecture Using Staggered Launch-on-Shift for Testing Designs Containing Asynchronous Clock Domains", 2010 25th International Symposium on Defect and Fault Tolerance in VLSI Systems, 2010, IEEE.
Krishnamurthy, Prabhu, "Power-Aware DFT-Do we really need it?", International Test Conference, Panel 1.2, 2008, IEEE.

* cited by examiner

*Primary Examiner* — David Ton
(74) *Attorney, Agent, or Firm* — David A. Cain; Hoffman Warnick LLC

(57) ABSTRACT

Aspects of the invention provide for decreasing the power supply demand during built-in self test (BIST) initializations. In one embodiment, a BIST architecture for reducing the power supply demand during BIST initializations, includes: a chain of slow BIST I/O interfaces; a chain of fast BIST I/O interfaces, each fast BIST I/O interface connected to a slow BIST I/O interface; and a BIST engine including a burst staggering latch for controlling a multiplexor within each of the slow BIST I/O interfaces, wherein the burst staggering latch, for a first burst signal, staggers the first burst signal to each of the slow BIST I/O interfaces, such that, during a first clock cycle, only a first slow BIST I/O interface receives the first burst signal.

20 Claims, 5 Drawing Sheets

DECREASING POWER SUPPLY DEMAND DURING BIST INITIALIZATIONS

FIELD OF THE INVENTION

The disclosure relates generally to integrated circuits, and more particularly, to a method of decreasing power supply demand during built-in self test (BIST) initializations.

BACKGROUND

In more recent chip designs, memories occupy a large percentage of the chip area. With advances in technology, more and more memory cells are closely packed, thereby increasing the number of faults being detected on the memory. In order to test the memories for all possible fault types, a comprehensive memory built-in self-test (BIST) solution is required. Memories are generally grouped together based on the memory type and a group of memories are tested by a single BIST engine in parallel. In order to test the memories thoroughly and minimize the impact to test time, there are multiple BIST engines in a chip, operating in parallel and thereby testing multiple groups of memories in parallel. In current technology, up to 16 memories are able to share, as a group, a single BIST engine.

Today, both at manufacturing test, and during system test modes, when testing memories using BIST, the BIST engines are activated at the same time. Each BIST engine will start testing a plurality of memories (e.g., 16) associated with it in parallel. As all the memories start read/write operation in parallel, and in a concurrent fashion, a considerable amount of current is abruptly demanded from the power supply network. This sudden and abrupt demand on the power supply at the start of the BIST execution can result in a memory functional failure or a functional failure in the BIST logic itself.

Prior attempts to mitigate BIST startup power demand issues within the memory design include sending "dummy read" instructions to memory for many cycles, in order to allow the power supply time to settle, prior to providing any real operations to the memories. This effectively deals with the problem of memories failing due to temporary power supply voltage integrity, by letting the memories fail for a short duration, until the power supply network voltage settles to a more reasonable voltage, at which time the memories are expected to function. But, this method does nothing to address the BIST logic functionality issues that may arise due to sudden and abrupt demands on the power supply. While the memories are allowed to fail during this short time period, the BIST logic is still expected to function correctly.

However, the BIST circuit may not work correctly if the power supply voltage actually exceeds the voltage range used during the design analysis specific to BIST logic timing closure. At-speed BIST may place a significant and abrupt demand on the power supply especially when the BIST starts execution. The sudden demand in power supply current at the start of memory BIST, due to all BIST engines starting operation, in parallel, will contribute to a large voltage bounce in the power supply to the memories and the BIST logic, due to the L*(di/dt) component of the power supply network. This large bounce can lead to memory failures and incorrect values getting captured in one or more state elements of the BIST logic. The BIST logic will be especially sensitive when running with an edge-based clock mode, when hold time margin is of the most concern.

This disclosure addresses this power demand issue at the start of the BIST execution, by executing the start of BIST patterns in such a way as to limit the abruptness of the sudden demand on the power supply.

BRIEF SUMMARY

Aspects of the invention provide for decreasing the power supply demand during built-in self test (BIST) initializations. In one embodiment, a BIST architecture for reducing the power supply demand during BIST initializations, includes: a chain of slow BIST I/O interfaces; a chain of fast BIST I/O interfaces, each fast BIST I/O interface connected to a slow BIST I/O interface; and a BIST engine including a burst staggering latch for controlling a multiplexor within each of the slow BIST I/O interfaces, wherein the burst staggering latch, for a first burst signal, staggers the first burst signal to each of the slow BIST I/O interfaces, such that, during a first clock cycle, only a first slow BIST I/O interface receives the first burst signal.

A first aspect of the disclosure provides a built-in self test (BIST) architecture for reducing the power supply demand during BIST initializations, comprising: a chain of slow BIST I/O interfaces; a chain of fast BIST I/O interfaces, each fast BIST I/O interface connected to a slow BIST I/O interface; and a BIST engine including a burst staggering latch for controlling a multiplexor within each of the slow BIST I/O interfaces, wherein the burst staggering latch, for a first burst signal, staggers the first burst signal to each of the slow BIST I/O interfaces, such that, during a first clock cycle, only a first slow BIST I/O interface receives the first burst signal.

A second aspect of the disclosure provides a method of decreasing power supply demand on built-in self test (BIST) initializations, comprising: providing a chain of slow BIST I/O interfaces, each slow BIST I/O interface connected to a fast BIST I/O interface, each slow BIST I/O interface including a multiplexor; providing a burst staggering latch to control the multiplexor in each of the slow BIST I/O interfaces; and sending a first burst signal to each of the slow BIST I/O interfaces, wherein the burst staggering latch staggers the first burst signal, such that, during a first clock cycle, only the first slow BIST I/O interface receives the first burst signal.

A third aspect of the disclosure provides a method of decreasing power supply demand during built-in self test (BIST) initializations, comprising: providing a chain of slow BIST I/O interfaces, each slow BIST I/O interface connected to a fast BIST I/O interface, each slow BIST I/O interface including a multiplexor; providing a burst staggering latch to control the multiplexor in each of the slow BIST I/O interfaces; sending a first burst signal to each of the slow BIST I/O interfaces, wherein the burst staggering latch staggers the first burst signal, such that, during a first clock cycle, only the first slow BIST I/O interface receives the first burst signal; holding the first burst signal at a register in the first slow BIST I/O interface for a second clock cycle; and sending, based on controls from the burst staggering latch, the first burst signal, on a third clock cycle, to a second slow BIST I/O interface in the chain of slow BIST I/O interfaces.

BRIEF DESCRIPTION OF THE DRAWINGS

The above and other aspects, features and advantages of the disclosure will be better understood by reading the following more particular description of the disclosure in conjunction with the accompanying drawings.

Figure 1:
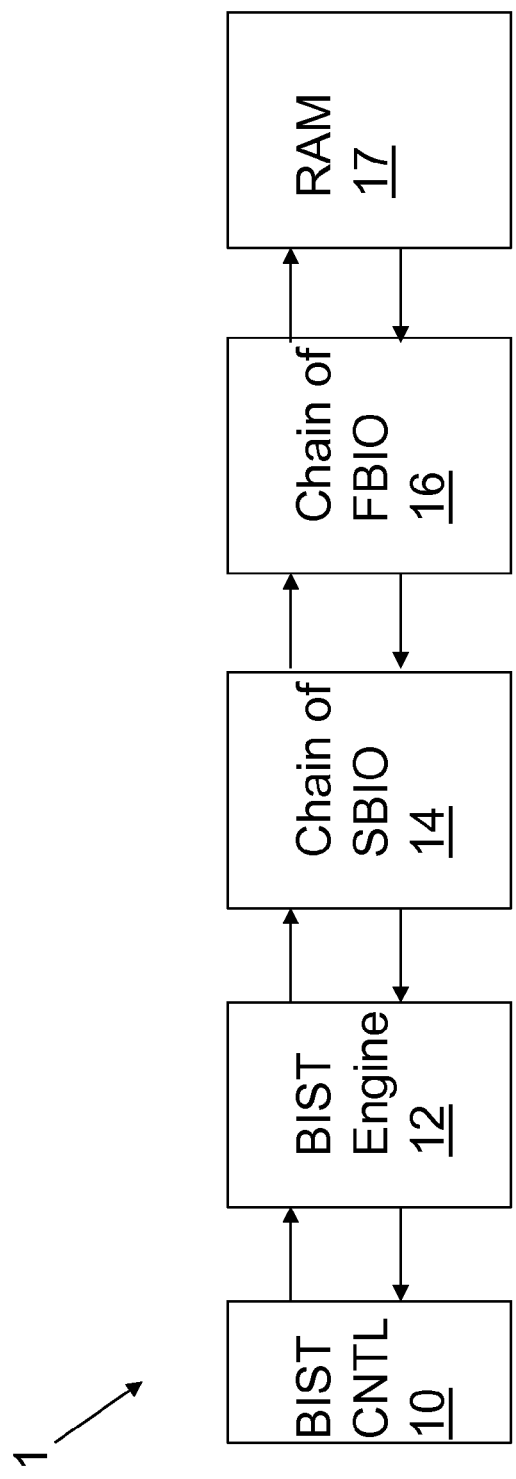
FIG. 1 shows a block diagram of a conventional BIST system architecture.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to integrated circuits, and more particularly, to a method of decreasing power supply demand during built-in self test (BIST) initializations.

In more recent chip designs, memories occupy a large percentage of the chip area. With advances in technology, more and more memory cells are closely packed, thereby increasing the number of faults being detected on the memory. In order to test the memories for all possible fault types, a comprehensive memory built-in self-test (BIST) solution is required. Memories are generally grouped together based on the memory type and a group of memories are tested by a single BIST engine in parallel. In order to test the memories thoroughly and minimize the impact to test time, there are multiple BIST engines in a chip, operating in parallel and thereby testing multiple groups of memories in parallel. In current technology, up to 16 memories are able to share, as a group, a single BIST engine.

Today, both at manufacturing test, and during system test modes, when testing memories using BIST, the BIST engines are activated at the same time. Each BIST engine will start testing a plurality of memories (e.g., 16) associated with it in parallel. As all the memories start read/write operation in parallel, and in a concurrent fashion, a considerable amount of current is abruptly demanded from the power supply network. This sudden and abrupt demand on the power supply at the start of the BIST execution can result in a memory functional failure or a functional failure in the BIST logic, itself.

Prior attempts to mitigate BIST startup power demand issues within the memory design include sending "dummy read" instructions to memory for many cycles, in order to allow the power supply time to settle, prior to providing any real operations to the memories. This effectively deals with the problem of memories failing due to temporary power supply voltage integrity, by letting the memories fail for a short duration, until the power supply network voltage settles to a more reasonable voltage, at which time the memories are expected to function. But, this method does nothing to address the BIST logic functionality issues that may arise due to sudden and abrupt demands on the power supply. While the memories are allowed to fail during this short time period, the BIST logic is still expected to function correctly.

However, the BIST circuit may not work correctly if the power supply voltage actually exceeds the voltage range used during the design analysis specific to BIST logic timing closure. At-speed BIST may place a significant and abrupt demand on the power supply especially when the BIST starts execution. The sudden demand in power supply current at the start of memory BIST, due to all BIST engines starting operation, in parallel, will contribute to a large voltage bounce in the power supply to the memories and the BIST logic, due to the L*(di/dt) component of the power supply network. This large bounce can lead to memory failures and incorrect values getting captured in one or more state elements of the BIST logic. The BIST logic will be especially sensitive when running with an edge-based clock mode, when hold time margin is of the most concern.

This disclosure addresses this power demand issue at the start of the BIST execution, by executing the start of BIST patterns in such a way, as to limit the abruptness of the sudden demand on the power supply.

Aspects of the invention provide for decreasing the power supply demand during built-in self test (BIST) initializations. In one embodiment, a BIST architecture for reducing the power supply demand during BIST initializations, includes: a chain of slow BIST I/O interfaces; a chain of fast BIST I/O interfaces, each fast BIST I/O interface connected to a slow BIST I/O interface; and a BIST engine including a burst staggering latch for controlling a multiplexor within each of the slow BIST I/O interfaces, wherein the burst staggering latch, for a first burst signal, staggers the first burst signal to each of the slow BIST I/O interfaces, such that, during a first clock cycle, only a first slow BIST I/O interface receives the first burst signal.

Figure 2:
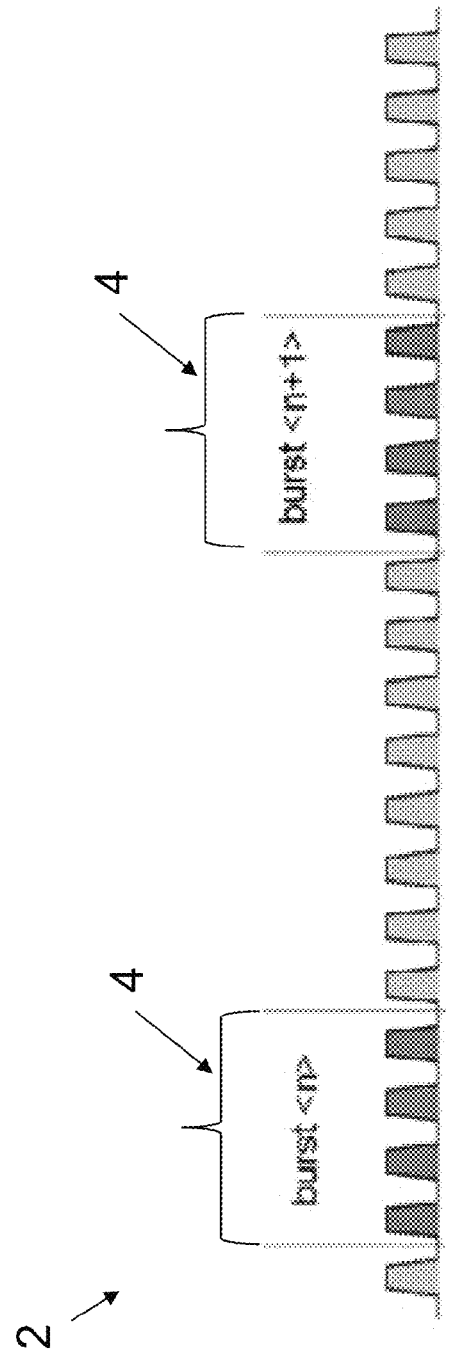
FIG. 2 shows a conventional waveform of BIST cycles with burst architecture.

Turning now to FIG. 1, a block diagram of a conventional BIST system architecture 1 is shown. BIST system architecture 1 may be used, for example, for 45 nm, 32 nm, and 22 nm technology nodes. A BIST CNTL 10 is used to control a group of BIST engines, shown collective as BIST engine 12. BIST engines 12 are each, in turn, used to control the various memory interface blocks (BIO). The memory interface block (BIO) includes the SBIO 14, which is a chain of slow BIST input/output interface blocks, and a FBIO 16, which is a chain of fast BIST input/output interface blocks. Chain of SBIO 14 is operated, along with the BIST engines 12 and BIST CNTL 10 using a common slow clock. Chain of FBIO 16 is operated by the corresponding memory's functional clock and is used to apply the individual BIST operations (reads and writes) to the memory, RAM 17, using the at-speed functional clock. The BIST circuit sets up a group of memory operations using a slow clock, which are, upon the BIST issuing a "GO" signal through the SBIO 14 to the FBIO 16, to be applied by the FBIO 16 to the memory 17 as a "burst" of 4 operations, using the functional (fast) clock. When the execution of a "burst" completes, a "STOP" signal is sent to the BIST engine 12 from the FBIO memory interface block 16. The data read from the memory 17 will be compared in the SBIO block 14, with the "expect data" over 4 slow clock cycles, and during these same 4 slow clock cycles, the BIST engine 12 will generate 4 memory operations in preparation for the next "burst". To optimize the area, only one-fourth of the data is compared to the "expect data" during each slow clock cycle in the SBIO 14. It is for this reason, that only 1 of the 4 operations in a "burst" can include a memory read-capture operation. Turning now to FIG. 2, a conventional waveform of 2 BIST cycles with burst architecture is shown.

Figure 3:
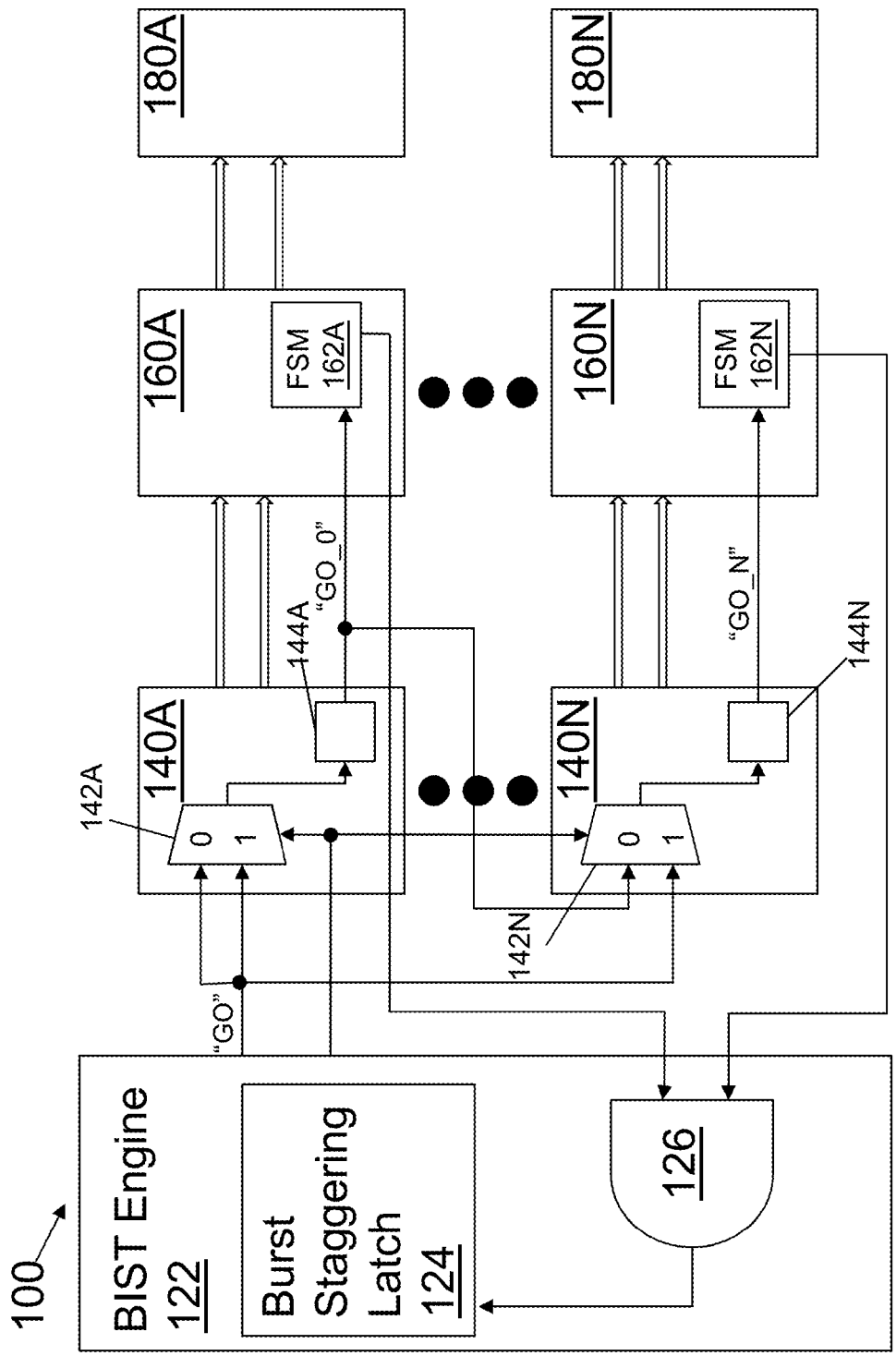
FIG. 3 shows a BIST architecture according to embodiments of the invention.

Turning now to FIG. 3, a BIST architecture 100 for reducing power supply demand during BIST initializations according to embodiments of the invention is shown.

BIST architecture 100 includes a BIST engine 122, including a burst staggering latch 124 for controlling and staggering a first burst signal "GO" to be sent and received by a chain of slow BIST I/O interfaces (SBIO) 140A-N and subsequently a chain of fast BIST I/O interfaces (FBIO) 160A-N (and then memory 160A-N). Each FBIO 160A-N is connected to a SBIO 140A-N. The first burst signal "GO" includes a plurality of memory operations for memory 180A-B.

Each SBIO 140A-N includes a 2-1 multiplexor 142A-N and a register 144A-N. The "1" input of each multiplexor 142A-N is the first burst signal "GO". The first SBIO 140A has the first burst signal "GO" as both "0" and "1" inputs to the multiplexor 142A. However, the "0" input for the multiplexor 142N of every subsequent SBIO 140N is coupled to the output of the register 144 of the previous SBIO 140. For example, as shown in FIG. 3, the "0" input of multiplexor 142N is the output of register 144A of the first SBIO 140A. Although only two SBIO 140A-N and two FBIO 160A-N are shown in FIG. 3, it is understood that any number of SBIO and FBIO may exist in each chain. The selection input for each of the multiplexors 142A-N is provided by the burst staggering latch 124.

Each FBIO 160A-N includes a finite state machine (FSM) 162A-N that receives the output of the register 144A-N of the SBIO 140A-N to which the FBIO 160A-N is connected. The output of each FSM 162A-N is sent to a logic gate (shown as an "AND" gate) 126 in BIST engine 122. The output of logic gate 126 is sent to burst staggering latch 124 and, as will be described later herein, signals the end of the first burst signal "GO."

Figure 4:
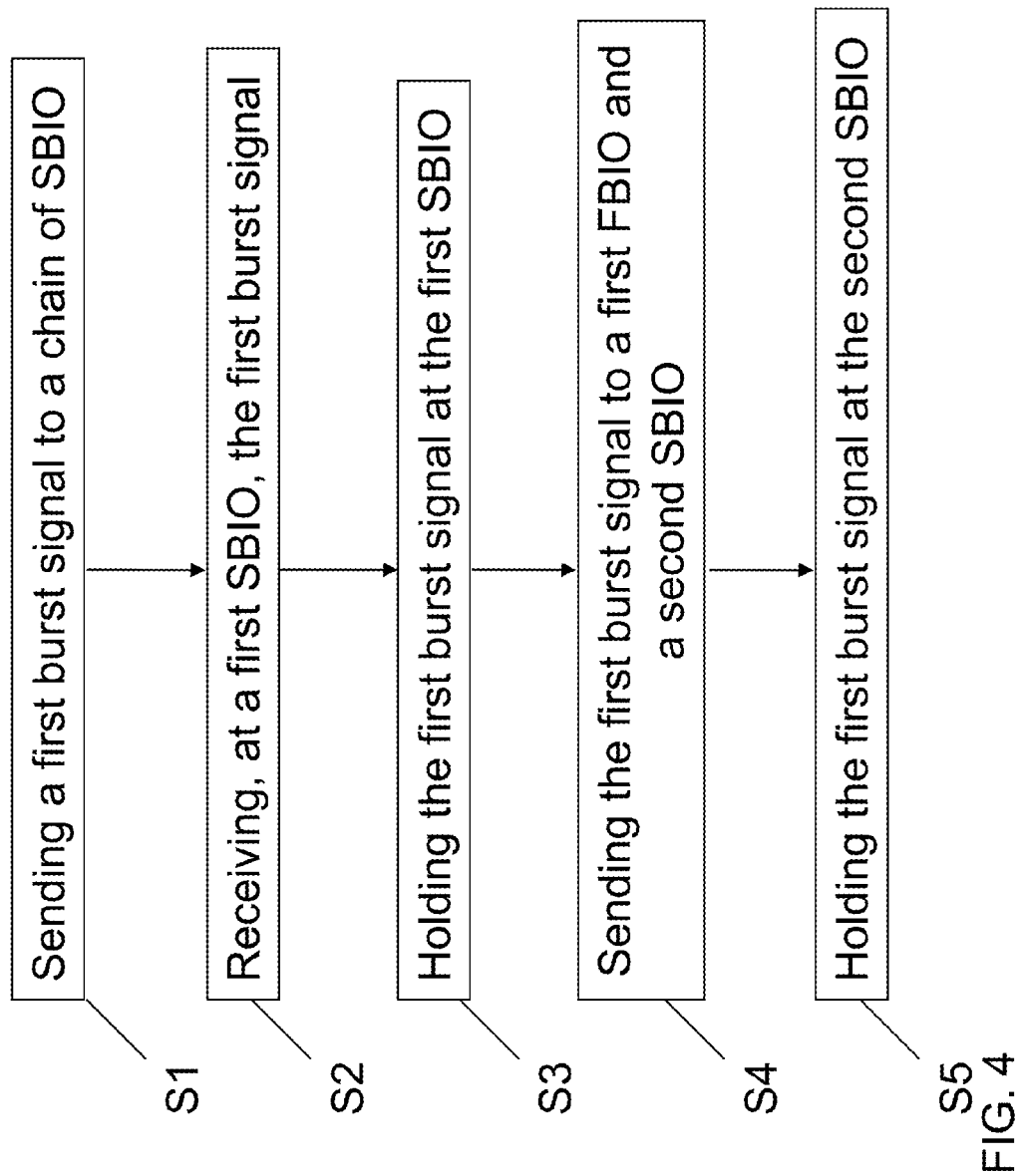
FIG. 4 shows a flow diagram of a method of decreasing power supply demand during BIST initialization according to embodiments of the invention.

Turning now to FIG. 4, a flow diagram of a method of decreasing power supply demand during BIST initializations is shown and will be described with reference to FIG. 3.

At S1, a first burst signal "GO" is sent to each SBIO 140A-N, to the "1" input of multiplexor 142A-N. The first burst signal "GO" is also sent to the "0" input of multiplexor 142A of the first SBIO 140A. A selection signal from the burst staggering latch 124 staggers the first burst signal "GO", such that, during a first clock cycle, only the first SBIO 140A receives the first burst signal "GO" (S2). This signal "GO" is received and held (S3) by register 144A in the first SBIO 140A for a second clock cycle. On a third clock cycle, at S4, the selection signal from the burst stagger latch 124 controls the multiplexor 142N, such that the second slow SBIO 140N receives the first burst signal "GO". Simultaneously, on this third clock cycle, first FBIO 160A receives the first burst signal "GO" from register 144A at FSM 162A. At S5, during a fourth clock cycle, the second register 144N of second SBIO 140N will hold the first burst signal "GO".

The burst staggering latch 124 will continue to stagger the first burst signal "GO", such that during a clock cycle, only one SBIO 140 at a time will receive and hold the "GO" signal and pass the signal to the respective connected FBIO 160. In this way, each SBIO 140A-N, each FBIO 160A-N, and each memory 180A-N will not be initialized at the same time, thereby reducing the abrupt increase in power supply demand during a first burst signal "GO".

Once each FBIO 160A-N receives the first burst signal "GO", each FBIO 160A-N sends a signal from each FSM 162A-N to a logic device 126 of the BIST engine 122. For example, as shown in FIG. 3, logic device 126 includes an "AND" gate. The output of the logic device 126 signals to the burst staggering latch 124 to no longer stagger subsequent burst signals (i.e., through selection signal to multiplexors 142A-N).

Figure 5:
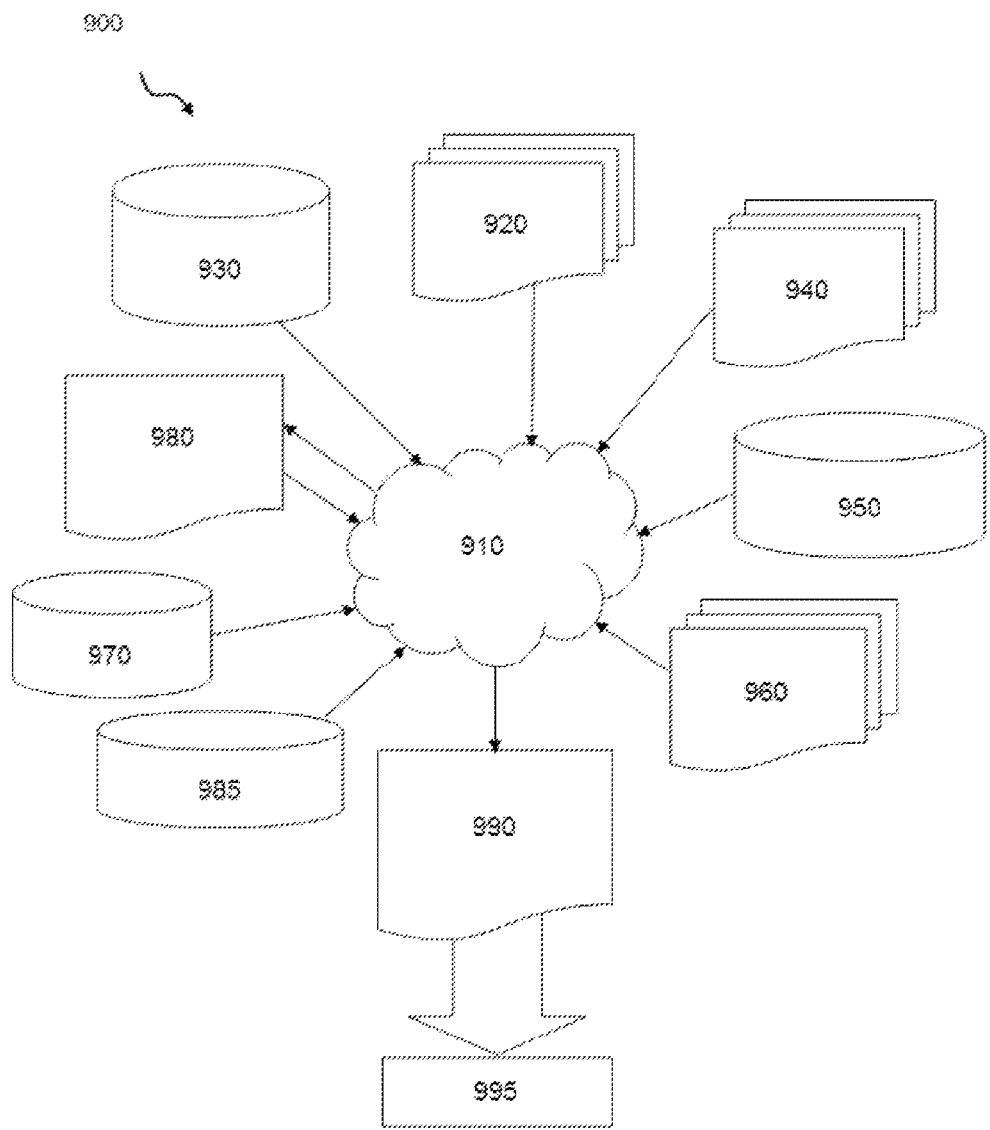
FIG. 5 is a flow diagram of a design process used in semiconductor design, manufacture, and/or test according to embodiments of the invention.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 3-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-4. In one embodiment, design structure 990 may comprise a compiled, executable HDL simulation model that functionally simulates the devices shown in FIGS. 3-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-4. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A built-in self test (BIST) architecture for reducing the power supply demand during BIST initializations, comprising:
   a chain of slow BIST I/O interfaces;
   a chain of fast BIST I/O interfaces, each fast BIST I/O interfaces connected to a slow BIST I/O interface; and
   a BIST engine including a burst staggering latch for controlling a multiplexor within each of the slow BIST I/O interfaces, wherein the burst staggering latch, for a first burst signal, staggers the first burst signal to each of the slow BIST I/O interfaces, such that, during a first clock cycle, only a first slow BIST I/O interface receives the first burst signal.

2. The BIST architecture of claim 1, further comprising a register in each slow BIST I/O interface for holding the first burst signal for a second clock cycle, prior to sending the first burst signal to a next slow BIST I/O interface in the chain of slow BIST I/O interfaces.

3. The BIST architecture of claim 1, wherein each fast BIST I/O interface includes a finite state machine for receiving the first burst signal, such that, during a third clock cycle, a first fast BIST I/O interface and the second slow BIST I/O interface receive the first burst signal from the first slow BIST I/O interface.

4. The BIST architecture of claim 3, wherein the BIST engine includes logic for receiving a signal from each finite state machine in the chain of fast BIST I/O interfaces, such that the burst staggering latch does not stagger subsequent burst signals.

5. The BIST architecture of claim 4, wherein the logic includes an AND gate.

6. The BIST architecture of claim 1, wherein the first burst signal includes a series of memory operations.

7. A method of decreasing power supply demand on built-in self test (BIST) initializations, comprising:

providing a chain of slow BIST I/O interfaces, each slow BIST I/O interface connected to a fast BIST I/O interface, each slow BIST I/O interface including a multiplexor;

providing a burst staggering latch to control the multiplexor in each of the slow BIST I/O interfaces; and sending a first burst signal to each of the slow BIST I/O interfaces, wherein the burst staggering latch staggers the first burst signal, such that, during a first clock cycle, only the first slow BIST I/O interface receives the first burst signal.

8. The method of claim 7, further comprising holding the first burst signal at a register in the first slow BIST I/O interface for the second clock cycle.

9. The method of claim 8, further comprising sending, based on controls from the burst staggering latch, the first burst signal, on a third clock cycle, to a next slow BIST I/O interface in the chain of slow BIST I/O interfaces.

10. The method of claim 9, wherein each fast BIST I/O interface includes a finite state machine for receiving the first burst signal, such that, during the third clock cycle, a first fast BIST I/O interface receives the first burst signal from the first slow BIST I/O interface.

11. The method of claim 10, further comprising receiving, at a logic device of the BIST engine, a signal from each finite state machine in a chain of fast BIST I/O interfaces, such that the burst staggering latch does not stagger subsequent burst signals.

12. The method of claim 11, wherein the logic device includes an AND gate.

13. The method of claim 7, wherein the first burst signal includes a series of memory operations.

14. A method of decreasing power supply demand during built-in self test (BIST) initializations, comprising:

providing a chain of slow BIST I/O interfaces, each slow BIST I/O interface connected to a fast BIST I/O interface, each slow BIST I/O interface including a multiplexor;

providing a burst staggering latch to control the multiplexor in each of the slow BIST I/O interfaces;

sending a first burst signal to each of the slow BIST I/O interfaces, wherein the burst staggering latch staggers the first burst signal, such that, during a first clock cycle, only the first slow BIST I/O interface receives the first burst signal;

holding the first burst signal at a register in the first slow BIST I/O interface for the second clock cycle; and sending, based on controls from the burst staggering latch, the first burst signal, on a third clock cycle, to a second slow BIST I/O interface in the chain of slow BIST I/O interfaces.

15. The method of claim 14, further comprising sending the first burst signal, on the third clock cycle, from the first slow BIST I/O interface to a finite state machine of a first fast BIST I/O interface.

16. The method of claim 15, further comprising holding the first burst signal at a register in the second slow BIST I/O interface for a fourth clock cycle.

17. The method of claim 16, further comprising, on a fifth clock cycle, sending the first burst signal to a third slow BIST I/O interface and a finite state machine on a second fast BIST I/O interface.

18. The method of claim 17, further comprising receiving, at a logic device in the BIST engine, a signal from each finite state machine in a chain of fast BIST I/O interfaces, such that the burst staggering latch does not stagger subsequent burst signals.

19. The method of claim 18, wherein the logic device includes an AND gate.

20. The method of claim 14, wherein the first burst signal includes a series of memory operations.

\* \* \* \* \*